United States Patent [19]

Buhrer

[11] 4,156,252

[45] May 22, 1979

[54] OSCILLATOR, AND METHOD OF ADJUSTING AN OSCILLATOR TO A STANDARD

[76] Inventor: Carl F. Buhrer, 6 Murphy Cir., Framingham, Mass. 01701

[21] Appl. No.: 840,909

[22] Filed: Oct. 11, 1977

[51] Int. Cl.$^2$ .................. H03B 19/00; H04N 9/62
[52] U.S. Cl. ............................... 358/10; 331/44
[58] Field of Search ............ 358/10; 325/363; 331/1 R, 44 X, 18, 37, 51

[56] References Cited

U.S. PATENT DOCUMENTS 3,958,269   5/1976   Davis ........................... 358/10

OTHER PUBLICATIONS

QST pp. 33-40, May 1965.
"Frequency Standard Hides in Every Color TV Set", Davis, *Electronics* 5/10/71, pp. 96-98.
"Calibrating Crystal Oscillators with TV Color Reference Signals", Davis, *Electronics* 5/20/75.
*Radio-Electronics* pp. 74-76, 108 Robbins, Sep. 1976.

*Primary Examiner*—Robert L. Richardson

[57] ABSTRACT

The frequency of an oscillator which nominally is to oscillate at 3375 kilohertz can be adjusted conveniently by tuning a color television receiving set to a color program transmitted by a television network. The output of the oscillator to be adjusted is coupled to the color television set such as at the chroma input terminal of the color-demodulation circuit. The oscillator is adjusted until a colored vertical stripe pattern appears on the screen of the set and either appears stationary or drifts to the right one stripe width in about 9.31 seconds.

An oscillator, adapted to oscillate at 3375 kilohertz, can generate 111 different integral (i.e., Hertz) frequencies in association with appropriate frequency dividing means.

5 Claims, 2 Drawing Figures

OSCILLATOR, AND METHOD OF ADJUSTING AN OSCILLATOR TO A STANDARD

BACKGROUND OF THE INVENTION

1. Field of the Invention

This invention relates to methods of adjusting certain oscillators to a standard, and to oscillators adapted to oscillate at a nominal frequency of 3375 kilohertz. Accordingly, it is a general object of this invention to provide new and improved methods and oscillators of such nature.

2. Description of the Prior Art

Precisely made quartz crystals are capable of controlling, with a high degree of accuracy, the frequency of various communications and related electronic equipment. For example, VHF and UHF transceivers using narrow bandwidths must maintain their frequency close to the center of their operating channel. Many of these transceivers incorporate frequency synthesizer techniques, and, for these, a standard frequency crystal oscillator of high precision is required. It is usually in the 1 to 5 MHz range and is frequency divided to some lower frequency related to the synthesized channel frequency spacing. For alignment of these transceivers, the standard frequency oscillator is set precisely; for non-synthesized transceivers, the frequencies are usually set with an electronic counter having as a time base a frequency of comparable high precision.

The alignment of such a frequency reference standard to the required accuracy has been made by varying a small trimmer capacitor in the crystal oscillator circuit until the frequency matches some standard source such as the radio transmissions of the National Bureau of Standards at 2.5, 5, 10 or 15 MHz or at the lower frequency of 60 kHz. Reception of the high frequency signals is subject to propagation disturbances which make comparison difficult much of the time, while use of a local standard based on the reception of the 60 kHz signal is of limited utility because of the complexity and generally high cost of the required low frequency receiver. Direct comparison with an atomic controlled frequency standard such as cesium or rubidium clock is also generally ruled out because of their cost. To surmount these difficulties, the National Bureau of Standards has determined that a standard frequency can be distributed over the country via the color television network system in the form of the frequency of the color subcarrier. Presently, network color programming originating in New York and Los Angeles contain a color burst frequency synchronized to such an atomic standard. Thus, a color television receiver receiving such programs can at the proper times be used as a frequency standard of high precision.

A technique for using this standard was developed at the NBS. Basically, it involves the construction of a high precision 5 MHz crystal oscillator and a second crystal oscillator at the color burst frequency of 3.5795454... MHz phase locked to the first, using frequency synthesizer techniques. Two oscillators are used because the color burst frequency $f_c$ is not an integral multiple of any simple frequency which might serve as a time base or frequency reference such as 1 kHz or even 1 Hz. The horizontal sweep frequency $f_h$ used in color telecast display is 15.734265...kHz and the vertical sweep frequency $f_v$ is 59.94... Hz. All these frequencies are non-integral, but are interrelated by simple fractions, and are derived from one another and a 5 MHz output of the atomic frequency standard. The relationships are:

$$f_c = 5 \text{ MHz} \times \frac{63}{88}$$

$$f_h = f_c \times \frac{2}{455}$$

$$f_v = f_h \times \frac{2}{525}$$

The use of television color subcarrier for adjusting local frequency standards to high accuracy has been recommended by the National Bureau of Standards [*Electronics,* May 10, 1971, pp. 96–98, and Mar. 20, 1975, pp. 107–112]. The author of such articles, Dicky D. Davis, is the patentee of U.S. Pat. No. 3,958,269, issued May 18, 1976, entitled "Color Subcarrier Frequency Comparator".

Using the frequencies suggested by the applicant of this invention, including 3375 kilohertz, phase-locked-loop synthesis and display-generating circuitry in the frequency comparison are rendered unnecessary. Adjustments of an oscillator can be performed with just a color-TV receiver.

SUMMARY OF THE INVENTION

A 3375 kilohertz crystal oscillator is a good laboratory frequency standard because it is easily calibrated with great precision against a commercial TV network color signal, and because its frequency can be divided to provide many useful substandards. Several other frequencies also possess these characteristics to greater or lesser extent.

It is another object of this invention to provide a new and improved method for adjusting a 3375 kilohertz oscillator using a standard color television receiver as the only instrumentation necessary for such adjustment.

Yet another object of this invention is to provide a new and improved method for adjusting oscillators which operate at 3045 kHz, 3375 kHz, 3705 kHz, and 4035 kHz, using a standard color television receiver as the only instrumentation necessary for such adjustment.

Still another object of this invention is to provide a new and improved oscillator adapted to oscillate at a nominal frequency of 3375 kHz and frequency dividing means associated with the oscillator for generating frequencies selected from factors of such nominal frequency.

In accordance with a preferred embodiment of this invention, the frequency of an oscillator which nominally is to oscillate at 3375 kilohertz can be adjusted by utilizing the standardized television color signal transmitted by a television network. A color-TV receiver is tuned to a color program transmitted by the network. The output of the oscillator is coupled to the color-TV receiver. The oscillator is adjusted until a colored vertical stripe pattern appears on the screen of the receiver. In one feature, the stripe pattern is stationary. In another feature, the stripe pattern moves to the right one stripe width in about 9.31 seconds.

In accordance with another embodiment of the invention, an oscillator having a nominal frequency at 3045 kilohertz, 3705 kHz or 4035 kHz can be adjusted using the same standardized television color signal. In such instances, the colored stripe pattern, when stationary, intersects vertically 7, 7 and 14 times, respectively, and horizontally 34, 8 and 29 times, respectively, per full video frame for the selected oscillator frequency. Again, in one feature, the stripe pattern is stationary. In another feature, the stripe pattern moves to the right or to the left one stripe width in about 9.31 seconds.

In accordance with yet another embodiment of the invention, an oscillator is adapted to oscillate at a nominal frequency of 3375 kilohertz. Frequency dividing means are associated with the oscillator for generating frequencies which are factors of 3,375,000.

Figure 1:
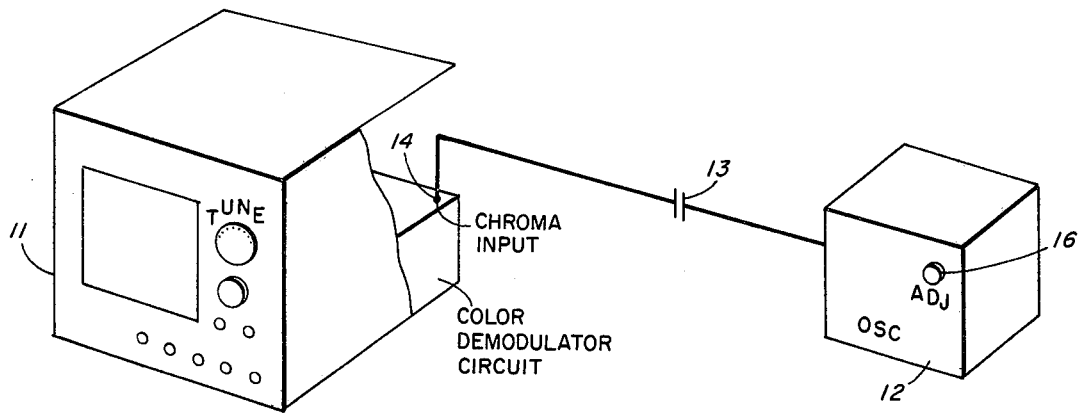
FIG. 1 is a block diagram of one embodiment of this invention.

For a better understanding of the present invention, together with other and further objects, features, advantages and capabilities thereof, reference is made to the following disclosure and appended claims in connection with the abovedescribed drawing.

DESCRIPTION OF THE PREFERRED EMBODIMENT

The invention is primarily designed for use in the United States, wherein the NTSC color television system is prevalent.

The method is based on the formation of steady colorstripe patterns on the TV screen when certain frequencies are substituted for the set's chroma signal. A succession of these stripes, each having a red, green and blue component, will intersect vertically m times and horizontally n times per full video frame for an input frequency $f_k$ given by:

$$f_k = f_c + nf_h + mf_v$$

Here n and m are positive or negative integers, and $f_c$, $f_h$, and $f_v$ are the color-subcarrier, horizontal-scan, and vertical-scan frequencies, respectively. All three are non-integral, but they are related as follows:

$$f_c = 5 \text{ MHz} \times 63/88 = 3.5795454 \ldots \text{ MHz}$$

$$f_h = f_c \times 2/455 = 15.734265 \ldots \text{ kHz}$$

$$f_v = f_h \times 2/525 = 59.940057 \ldots \text{ Hz}$$

The present invention is based on the observation that although all of the above frequencies are non-integral numbers of Hz, certain linear combinations of them are exact multiples of 15 kHz, and one such frequency at 3375 kHz has such small factors that a great many lower standard frequencies can be obtained by simple frequency division. These include 60 Hz, 100 Hz, 500 Hz, 1 kHz, 5 kHz, 25 kHz and 125 kHz. The importance of the linear combination frequencies of the form:

$$f_k = f_c + n f_h + m f_v \text{ with n and m integers}$$

results from the fact that if one of these frequencies is fed into an operating color television receiver in place of the normal chroma signal while the set is receiving a color telecast such that the color subcarrier oscillator is phase-locked to the color burst of the video signal being received, a stationary pattern of color stripes will be displayed on the screen. These stripes will each be a composite of all spectral colors in succession through red, green and blue across each stripe. The stripe pattern will be either vertical if m = 0, horizontal if n = 0 or at an angle so as to intercept the vertical axis m times and horizontal axis n times per video frame inclusive of the retrace intervals. Since small frequency deviations from $f_k$ will result in the drift of the stripe pattern an equal number of stripe widths per second, the frequencies $f_k$ can easily be adjusted to their exact value by observing and stopping the pattern drift with time.

The combination of the various frequencies, $f_k$, can be an integer. Those linear combination frequencies $f_k$ found to be useful for frequency standard use belong to the set $-f_1$, $f_0$, $f_{+1}$, $f_{+2}$ in which integers k and l select the n and m values according to the relations:

$$n = -13 + 21k + 13l \text{ and}$$

$$m = -7k + 9l l$$

Simplifying, $f_k$ becomes an integral multiple of 15 kHz, given by:

$$f_k = (255 + 22k + 14l) \times 15 \text{ kHz}$$

A table of the four most useful values of $f_k$ is given below, where $i$ is set to 0.

| k  | n   | m   | $f_k$    | Factors                      |
|----|-----|-----|----------|------------------------------|
| -1 | -34 | +7  | 3045 kHz | $7 \times 29 \times 15$ kHz  |
| 0  | -13 | 0   | 3375 kHz | $3^2 \times 5^2 \times 15$ kHz |
| +1 | +8  | -7  | 3705 kHz | $13 \times 19 \times 15$ kHz |
| +2 | +29 | -14 | 4035 kHz | $269 \times 15$ kHz          |

The table shows suggested standard frequencies that correspond to k of −1, 0, 1 and 2. For the non-0 values of k, m is not 0, and the result is diagonal stripe patterns on the TV screen. Therefore, 3375 kHz is the most useful as a standard frequency; since m = 0, that frequency gives a vertical stripe pattern easily distinguished from the associated m = ± 1 frequencies, which are 59.94 . . . . hertz away. Moreover, all of its prime factors are small; 3375 kHz = $2^3 \times 3^3 \times 5^6$ Hz, so a variety of lower frequencies such as 50, 60, 500 Hz, 1, 3, 5, 15, 25 . . . kHz can be obtained directly by division.

Simply, as by reference to FIG. 1, a color television receiving set 11 is tuned to a color television program originated by a network. The oscillator 12 to be adjusted is coupled, as by a capacitor 13 to the television set 11, either preferably to the chroma input 14 of the color demodulation circuit, or, less preferred, to the antenna input terminals (not shown). The oscillator 12 can be adjusted, as by varying a small trimmer capacitor 16 associated with the crystal oscillator circuit. Adjustment of the oscillator 12 against the TV networks' rubidium standard for color video transmission requires selection of a broadcast originating live in New York or Los Angeles, where the standards are located. A sample of the 3375-kHz frequency is injected into the chroma input 14 of the demodulator circuit after the program color is turned off with the color-level control. About 1 to 2 volts fed into a 15-picofarad capacitor 13 connected to the chroma input pin 14 of the color-demodulator integrated circuit is sufficient to give vivid color stripes. (Since most TV chassis are not grounded, care is necessary to avoid electrical shock in this operation).

When the crystal oscillator 12 is tuned about 60 Hz higher than 3375 kHz, the pattern with n = −13, m = +1 appears, with stripes tilting to the left. As the oscillator frequency is lowered, this tilted pattern drifts faster and faster to the left until the drift is too fast to be observed. As 3375 kHz is approached, the desired vertical stripe pattern appears drifting to the right. As the frequency is further reduced through 3375 kHz the vertical stripe pattern stops and then starts drifting to the left. At about 60 Hz below 3375 kHz, the m = −1 stripe pattern, tilted to the right, appears to stop.

Apparently, the networks' frequency transmission were originally based on the duration of a second being 1/(24 × 60 × 60) of a day. The National Bureau of Standards definition of a second is related to the cesium atom. Thus, an error of less than one second per year exists between the two.

Because of the offset of approximately $-300 \times 10^{-10}$ in the network frequency relative to the National Bureau of Standards value, the crystal oscillator should be tuned to a frequency slightly higher than the network signal. This is done by adjusting the oscillator such that the vertical stripe pattern drifts to the right one stripe width in about 9.31 seconds. Exact offsets of the network standards are published regularly by NBS.

When 3705 kHz is used as the standard frequency, the directions of tilt and drift are reversed, because n is positive. This frequency is a desirable standard if its prime factors 13 or 19 are needed.

In essence, the invention includes a process by which an oscillator is adjusted to its exact frequency by the use of a color television receiver phase-locked via the the television networks to a centrally located atomic frequency standard. The oscillator is coupled to the input of the chroma signal processing circuit of the color television receiver after the color level control, such that the latter can be used to turn off the color signal from the program material.

DESCRIPTION OF ANOTHER EMBODIMENT

An oscillator 12, adapted to oscillate at a nominal frequency of 3375 kHz, can be coupled to a frequency divider 21 associated therewith for generating frequencies which are factors of 3,375,000, prime factors of which are: 1, 2, 2, 2, 3, 3, 3, 5, 5, 5, 5, 5 and 5. Other than 1 or 3,375,000, there are 110 integral factors of 3,375,000, including 60 Hz, 100 Hz, 500 Hz, 1 kHz, 5 kHz, 15 kHz, 25 kHz, and 125 kHz, for example.

Figure 2:
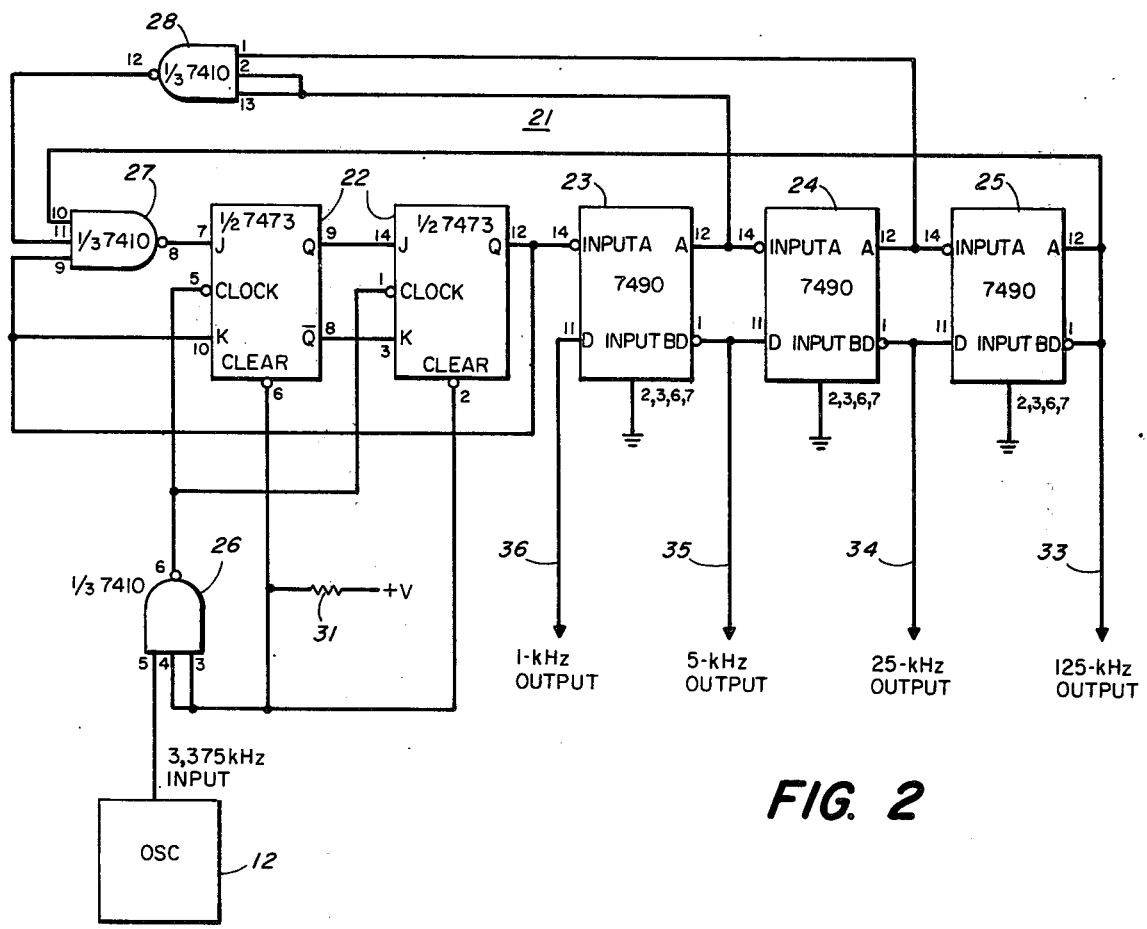
FIG. 2 is a block diagram of another embodiment of this invention.

Referring to FIG. 2, there is shown an example of use of the 3375 kHz standard to produce precision submultiples. A simple frequency divider 21 useful as a counter time base or frequency synthesizer reference consists of a 7473 dual flip-flop predivider 22 followed by three binary stages 23, 24, 25 with feedback to give a divide-by-27 output of 125 kHz and then three divide-by-5 stages with outputs at 25 kHz, 5 kHz, and 1 kHz. Harmonics of 125 kHz also permit comparison of this standard with all of the high-frequency transmissions of the Bureau of Standards.

In FIG. 2, a 7410 gating device can be used as three independent gates 26, 27, 28. The output of the oscillator 12 is coupled to terminal 5 of the gate 26. A fixed voltage, such as +5v, is coupled through a resistor 31 (which can be a 1 kilohm) to both the terminals 3 and 4 of the gate 26 and the clear terminals 2 and 6 of the dual flip-flop 22. The output terminal 6 of the gate 26 is coupled to the clock terminals 1 and 5 of the dual flip-flop 22. The Q and $\overline{Q}$ output terminals 9 and 8, respectively, of one flip-flop (of the dual 22) are coupled, respectively, to the J and K input terminals 14 and 3, respectively, of the other flip-flop (of the dual 22). The Q output terminal 12 is coupled: to an input A terminal 14 of the 7490 stage 23, to the K terminal 10 of the dual flip-flop 22, and to a terminal 9 of the gate 27. The output terminal 8 of the gate 27 is coupled to the J terminal 7 of the dual flip-flop 22.

The A terminal 12 of the 7490 stage 23 is coupled to an input A terminal of the 7490 stage 24. The A terminal 12 of the 7490 stage 24 is coupled to an input A terminal of the 7490 stage 25.

The A terminal 12 of the 7490 stage 25 is coupled: to an input BD terminal of the 7490 stage 25, to an input terminal 10 of the gate 27, and to a line 33 which provides a 125 kHz output.

The A terminal 12 of the 7490 stage 24 is coupled to a terminal 1 of the gate 28. The D terminal 11 of the 7490 stage 25 is coupled to an input BD terminal of the 7490 stage 24 and to a line 34 which provides a 25 kHz output.

The A terminal 12 of the 7490 stage 23 is coupled to terminals 2 and 13 of the gate 28, the output of which is coupled to a terminal 11 of the gate 27. The D terminal 11 of the 7490 stage 24 is coupled to an input BD terminal of the 7490 stage 23 and to a line 35 which provides a 5 kilohertz output.

The D terminal 11 of the 7490 stage 23 is coupled to a line 36 which provides a 1 kilohertz output.

IN GENERAL

It was mentioned earlier that the oscillator be adjusted so that the vertical colored stripe pattern drift to the right one stripe width in about 9.31 seconds. As will be recalled, the color subcarrier frequency is 3.579545 MHz, and the network frequency differs from the NBS standard by $-3000 \times 10^{-11}$. Thus, $$\frac{10^{-6} \text{ sec.}}{3.579545 \text{ cycles}} \times \frac{1}{3000 \times 10^{-11}} = 9.31217049 \ldots \text{ sec.}$$

While there has been shown and described what is at present considered the preferred embodiments of the invention, it will be obvious to those skilled in the art that various changes and modifications may be made therein without departing from the scope of the invention as defined by the appended claims.

I claim:

1. A method of adjusting the frequency of an oscillator which normally is to oscillate at 3375 kHz with a standardized television color signal transmitted by a television network comprising:
   (a) tuning a color television receiving set to a color program transmitted by a television network;
   (b) coupling the output of the oscillator to be adjusted to said color television receiving set; and
   (c) adjusting said oscillator until a colored vertical stripe pattern appears on the screen of said set and appears stationary.

2. A method of adjusting the frequency of an oscillator which normally is to oscillate at an oscillator frequency $f_k$ selected from the group 3045 kHz, 3375 kHz, 3705 kHz, and 4035 kHz with a standardized television color signal transmitted by a television network comprising:
   (a) tuning a color television receiving set to a color program transmitted by a television network;
   (b) coupling the output of the oscillator to be adjusted to said color television receiving set; and
   (c) adjusting said oscillator until a stationary colored stripe pattern appears on the screen of said set with said pattern intersecting vertically m times and horizontally n times per full video frame for a selected oscillator frequency $f_k$, wherein the quantities $f_k$, m, and n are related as follows:

| $f_k$ | m | n |
|---|---|---|
| 3045 kHz | 7 | 34 |
| 3375 kHz | 0 | 13 |
| 3705 kHz | 7 | 8 |
| 4035 kHz | 14 | 29 |

3. A method of adjusting the frequency of an oscillator which nominally is to oscillate at 3375 kHz with a standardized television color signal transmitted by a television network, which standardized signal is known to deviate from a National Bureau of Standards standard by approximately $-300 \times 10^{-10}$ of said signal comprising:
   (a) tuning a color television receiving set to a color program transmitted by a television network;
   (b) coupling the output of the oscillator to be adjusted to said color television receiving set; and
   (c) adjusting said oscillator until a colored vertical stripe pattern appears on the screen of said set and drifts to the right one stripe width in about 9.31 seconds.

4. A method of adjusting the frequency of an oscillator which nominally is to oscillate at an oscillator frequency $f_k$ selected from the group 3045 kHz, 3375 kHz, 3705 kHz, and 4035 kHz with a standardized television color signal transmitted by a television network, which standardized signal is known to deviate from a National Bureau of Standards standard by approximately $-300 \times 10^{-10}$ of said signal comprising:
   (a) tuning a color television receiving set to a color program transmitted by a television network;
   (b) coupling the output of the oscillator to be adjusted to said color television receiving set; and
   (c) adjusting said oscillator until a colored stripe pattern appears on the screen of said set with said pattern intersecting vertically m times and horizontally n times per full video frame for a selected oscillator frequency $f_k$, wherein the quantities $f_k$, m, and n are related as follows:

| $f_k$ | m | n |
|---|---|---|
| 3045 kHz | 7 | 34 |
| 3375 kHz | 0 | 13 |
| 3705 kHz | 7 | 8 |
| 4035 kHz | 14 | 29 | and wherein said colored stripe pattern drifts to the right one stripe width in about 9.31 seconds, for 3045 and a 3375 kHz and drifts to the left one stripe width in about 9.31 seconds for 3705 kHz and 4035 kHz.

5. An oscillator adapted to oscillate at a nominal frequency of 3375 kHz and frequency dividing means associated with said oscillator for generating frequencies selected from the group $(2^a \times 3^b \times 5^c)$ Hz, wherein a is an integer from 0 to 3, b is an integer from 0 to 3, and c is an integer from 0 to 6.

* * * * *

UNITED STATES PATENT OFFICE
CERTIFICATE OF CORRECTION

Patent No. 4,156,252　　　　　　　　Dated May 22, 1979

Inventor(s) Carl F. Buhrer

It is certified that error appears in the above-identified patent and that said Letters Patent are hereby corrected as shown below:

On the face of the patent: Section [73] should be inserted with Assignee: GTE LABORATORIES INCORPORATED, WALTHAM, Mass.

Signed and Sealed this

Ninth Day of October 1979

[SEAL]

Attest:

RUTH C. MASON
*Attesting Officer*

LUTRELLE F. PARKER
*Acting Commissioner of Patents and Trademarks*